United States Patent [19]
Leiby
[11] 3,831,109
[45] Aug. 20, 1974

[54] TEMPERATURE-COMPENSATED VOLTAGE-TUNABLE GUNN DIODE OSCILLATOR

[75] Inventor: Robert Frank Leiby, San Mateo, Calif.
[73] Assignee: Litton Systems, Inc., San Carlos, Calif.

[22] Filed: Feb. 9, 1973
[21] Appl. No.: 331,070

[52] U.S. Cl. ........... 331/107 G, 331/36 C, 331/176, 331/177 V, 332/30 V
[51] Int. Cl. ........... H03b 7/06
[58] Field of Search ........... 331/176, 177 V, 116 R, 331/36 C, 107 R, 107 G; 332/30 V; 334/15

[56] References Cited

UNITED STATES PATENTS

| | | | |
|---|---|---|---|
| 3,222,459 | 12/1965 | Drapkin | 332/30 V |
| 3,382,463 | 5/1968 | Hurtig | 332/30 V |
| 3,397,367 | 8/1968 | Steel et al. | 331/176 |
| 3,534,295 | 10/1970 | Gregory | 332/30 V |
| 3,579,281 | 5/1971 | Kam | 332/30 V |
| 3,713,033 | 1/1973 | Frerking | 331/176 |
| 3,735,286 | 5/1973 | Vane | 331/107 G |

FOREIGN PATENTS OR APPLICATIONS

| | | | |
|---|---|---|---|
| 1,238,956 | 7/1971 | Great Britain | 331/176 |

*Primary Examiner*—John Kominski
*Attorney, Agent, or Firm*—Ronald M. Goldman

[57] ABSTRACT

A novel temperature-compensated voltage-tuned Gunn diode oscillator is disclosed. The voltage-tuned Gunn diode oscillator is an oscillator of the type which contains a Gunn diode coupled to a frequency-determining circuit and includes a varactor, a voltage dependent capacitor, as an element of the oscillator frequency-determining network. Hence the oscillator may be tuned as a function of the voltage, sometimes termed the "modulating voltage," applied across the varactor by a modulating voltage source. A temperature dependent voltage source provides an output voltage which is a function of ambient temperature and functions as a source of compensating voltage. A first high resistance means is connected in series circuit between the source of modulating voltage input and the varactor; a second high resistance means is connected in series circuit between the output of the temperature-dependent voltage source and said varactor; and the resultant voltage applied to the varactor is proportional to the sum of the modulating source voltages and the temperature-dependent network output voltage. The "net" modulating voltage applied to the varactor to set the oscillator frequency includes an "offset" voltage to compensate for the ambient temperature. The temperature-dependent voltage source includes a first low resistance network connected to the same source of voltage which supplies the normal bias voltage to the Gunn diode and further includes a second resistive voltage divider network and a thermistor.

1 Claim, 4 Drawing Figures

TEMPERATURE-COMPENSATED VOLTAGE-TUNABLE GUNN DIODE OSCILLATOR

FIELD OF THE INVENTION

This invention relates to a voltage-turntable Gunn diode oscillator and, more particularly, to an improved voltage-tuned Gunn diode oscillator having a temperature-compensating network for minimizing drift of oscillator frequency with changes in ambient temperature.

BACKGROUND OF THE INVENTION

Gunn diode oscillators are used to generate high frequency energy, particularly at frequencies in the microwave range. Such oscillators include a conventional Gunn diode as the active element. The Gunn diode is coupled to a frequency-determining structure, such as a tuned cavity or line, which cooperates with the diode to determine the frequency of the signals generated thereby and is connected to a low voltage DC source which supplies bias operating voltages to the diode.

Voltage-tunable oscillators include a varactor as an element of the frequency-determining network. The varactor, as is known, is a voltage variable capacitor. Hence the effective capacitance provided by the varactor depends upon the level or magnitude of the DC voltage applied thereacross. One Gunn diode oscillator construction that is tunable over a broad frequency range and includes a varactor, is described in the copending application of Kenneth N. Kawakami, Ser. No. 217,153, filed Jan. 12, 1972, and now U.S. Pat. No. 3,739,298, to which reference is made.

One problem associated with the voltage-tunable Gunn diode oscillator is that the operating characteristics of the Gunn diode and of the associated tuning cavities and elements as well are affected by ambient temperature. Thus if all operating parameters, such as applied bias voltage, are maintained constant and the ambient temperature is varied, for example between 0° and 100°, the output frequency correspondingly changes, or as otherwise stated, "drifts." While this effect is not entirely avoidable it is highly desirable for any temperature-dependent frequency drift to be kept to a predetermined minimum, for example, 0.02 percent hertz per hertz per degree centigrade.

Various means to compensate or control variations of oscillator frequency due to changes in ambient temperature are known. One of the most basic means is a temperature controlled oven in which the oscillator is installed to maintain the oscillator structure at a single temperature. These are bulky and expensive. Then too, simple thermistor networks are known which provide compensation at some range of frequencies but which are inadequate over a large bandwidth of frequencies, such as the range from 9 to 11 GHz. Also various types of differential amplifier circuits can be included to provide compensation for temperature variation. These, however, require additional bias voltage sources and thus detract from the simplicity and small size benefits of the Gunn diode oscillator.

Accordingly it is an object of my invention to provide an improved temperature-compensated voltage-tunable Gunn diode oscillator.

It is a still further object of my invention to provide a temperature-compensating network for a voltage-tunable Gunn diode oscillator that requires no additional bias voltage supplies and which is relatively simple and easy to construct.

And it is a still further object of my invention to provide a temperature-compensated Gunn diode oscillator in which the frequency change is within 0.02 percent per degree centigrade over a broad bandwidth of frequencies between 9 and 11 gigahertz.

BRIEF SUMMARY OF THE INVENTION

In accordance with the foregoing objects the invention includes in combination: a Gunn diode oscillator of the type which includes a varactor as an element of the oscillator frequency-determining network; a modulating voltage source input for the varactor, and a bias voltage source input for the Gunn diode; a temperature-dependent compensating voltage source; a first high resistance connected in series circuit between said temperature-dependent voltage source input and the varactor input; a second high resistance connected in series circuit between the modulating voltage source input and the varactor input, whereby the net voltage applied to the varactor, to thereby determine the capacitance of said varactor, is proportional to the sum of the modulating voltage and the temperature-dependent voltage applied at said respective inputs.

Further in accordance with my invention the temperature-dependent voltage source includes a first low resistance resistor voltage divider network connected between electrical ground potential and the Gunn diode bias voltage source input. A second low impedance resistor voltage divider network is connected between electrical ground potential and a tap in the first voltage divider network. A thermistor, suitably having a negative temperature coefficient of resistance, is connected between ground and an end of a resistor in the second network and the output of the temperature-dependent voltage source is formed by connection to a tap in said second resistor network.

The foregoing objects and advantages of my invention as well as other objects and advantages thereof and the structural characteristics of my invention become more apparent from a review of the detailed description of the preferred embodiment of my invention, which follows, taken together with the illustrations thereof comprising the figures of the drawings.

DETAILED DESCRIPTION

Figure 1:
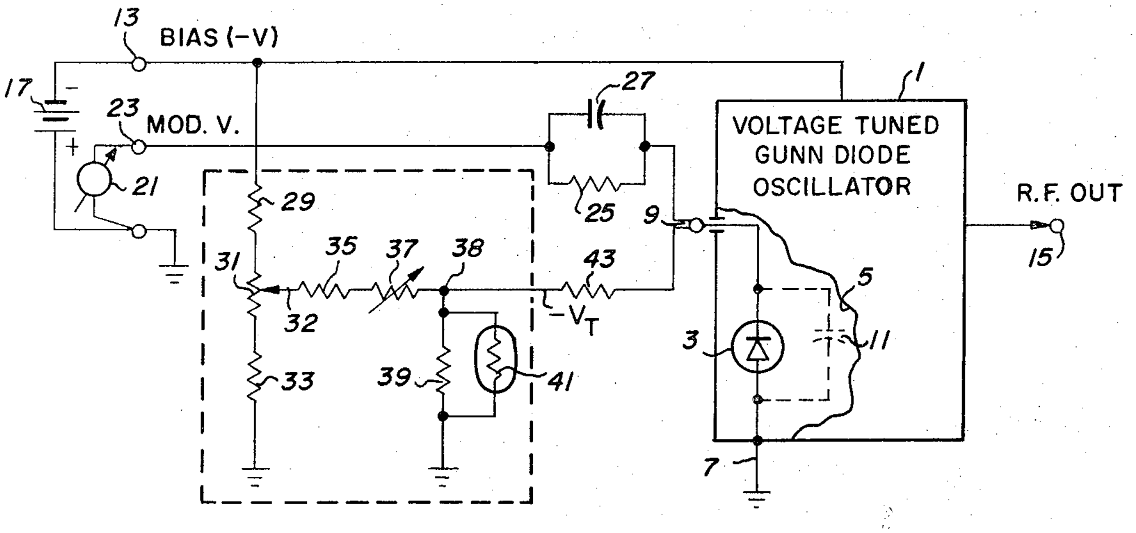
FIG. 1 illustrates a preferred embodiment of the temperature-compensated voltage-tunable Gunn diode oscillator of my invention.

A voltage-tunable Gunn diode oscillator 1 is illustrated in block diagram in FIG. 1. Such an oscillator includes a Gunn diode, not illustrated, a frequency-determining circuit, such as a microwave cavity of transmission line, not illustrated, coupled to the Gunn diode to establish appropriate conditions necessary to create high frequency oscillations, an input 13 for coupling the negative bias voltage source to the diode, a varactor 3, schematically illustrated and exposed by the cutaway portion 5, and a modulating voltage source 21 adapted to apply voltage to the varactor.

Insofar as the particular structure of a voltage-tunable Gunn diode oscillator is conventional and a detailed description of same and its mode of operation is not necessary to an understanding of my invention, such details are not illustrated or described here in detail. However reference may be made to the application of Kenneth N. Kawakami, Ser. No. 217,153, filed Jan. 12, 1972, and now U.S. Pat. No. 3,739,298, June 12, 1973 for an example of one such oscillator structure.

One end of varactor 3 is connected to electrical ground potential via lead 7 and its other end is connected to the modulating voltage input terminal 9 of the oscillator. A stray capacitance 11, which results from the stray capacitance of the varactor leads, and its package is represented by dash lines. An output 15, symbolically illustrated, provides means for conducting microwave signals to ancillary electronic equipment with which the oscillator is employed including, by way of example, a superheterodyne receiver in which the oscillator is employed in the "mixer" stage; a microwave receiver or transmitter in which the oscillator is employed in a frequency converter stage; a transmitter amplifier stage of a transmitter in which the oscillator is employed as a swept frequency driver; a microwave test equipment in which the oscillator is employed as a swept frequency microwave source.

A DC bias voltage source 17 is schematically illustrated. Bias source 17 is connected with its negative polarity output to input terminal 13 and has its positive polarity terminal connected to electrical ground potential. The bias source is of a low voltage, typically on the order of −8 to −12 volts DC.

A modulating voltage source 21, schematically illustrated, is connected between electrical ground potential and input terminal 23 with the positive polarity terminal of the source connected to the latter input terminal. Source 21 provides DC voltages that may be varied between different levels, such as between zero to +65 volts DC, by way of example. A resistor 25 of a high value and a capacitor 27, connected in shunt with resistor 25 to balance capacitance 11, are connected electrically in series between modulating voltage terminal 23 and varactor input terminal 9.

Resistor 29, potentiometer 31 and resistor 33 are electrically connected in series between ground potential and the bias voltage input terminal 13 to form a first resistive voltage divider network. The slider arm or adjustable tap 32 of potentiometer 31 supplies the output voltage from the first resistive voltage divider network. A thermistor 41 is connected in parallel with a resistor 39. Resistor 35, adjustable resistor 37 and the parallel combination of 39 and 41 are connected electrically in series to form a second voltage divider network. The resistance of thermistor 41 is substantially less than that of resistor 39, hence the resistance of thermistor 41 determines substantially the resistance of this arm of the second resistor voltage divider network. An output is formed at tap 38.

The first and second voltage divider networks form a temperature-dependent voltage source, as hereinafter becomes more apparent, and is outlined by a dash line. A resistor 43 of a large value is connected in series between the resistor bridge and the input terminal 9 of varactor 3.

The first resistive voltage divider network, comprising the series connection of resistors 29, 31 and 33, reduces the voltage of the bias source to a lower level which is some fraction of the source voltage and this reduced voltage appears at tap 32. The voltage divider network is of a low resistance so that any current drawn does not substantially alter the output voltage.

The second voltage divider network, comprising resistors 35, 37 and the parallel combination of resistors 39 and thermistor 41 forms a second voltage dividing network, which also has a low resistance characteristic. Thus the voltage which appears at tap 38 of the second voltage divider network is some fraction of the voltage at tap 32. These voltages are adjustable by means of the movable tap 32 and the adjustable resistance 37 in a manner hereinafter explained.

As is conventional the thermistor 41 exhibits a temperature-dependent resistive characteristic, suitably a negative temperature coefficient of resistance which varies, essentially, almost linearly with temperature. Thus as the ambient temperature increases, the resistance of thermistor 41 decreases. The negative voltage appearing at tap 38, accordingly increases. Alternatively as the ambient temperature decreases, the resistance of thermistor 41 increases and accordingly the negative voltage as appears at tap 38 increases.

The voltage at tap 38 is applied through the high resistance 43 to the input terminal 9. The modulating voltage from source 21 is likewise applied through a high resistance 25 to input terminal 9. This voltage is of a positive polarity. The resulting voltage at input terminal 9 is proportional to one-half of the algebraic sum of the voltages from the respective temperature-dependent voltage source and the modulating voltage as hereinafter explained.

By suitable adjustment and selection of the resistors and thermistors the temperature-dependent voltage source provides the desired increment of voltage at terminal 9 so as to offset the nominal modulating voltage, either adding or subtracting voltage therefrom depending upon the departure of temperature from room temperature, below or above, respectively, in an amount sufficient to change the capacitance of varactor 3 enough to bring the frequency of the oscillator to essentially the same frequency as the oscillator would have at room temperature (23° centrigrade).

One convenient way in which this is accomplished is to apply a given bias and modulating voltage to the unit and measure the frequency at room temperature.

The ambient temperature of the oscillator unit, including the temperature-depedent voltage source, is then reduced to the lowest extreme, suitably −1° C., with the bias voltage and modulating voltage left unchanged. Accordingly the oscillator frequency "drifts" and the thermistor 41 is at its highest resistance level. Tap 32 of potentiometer resistor 31 is then adjusted to select the appropriate level of voltage to be applied via output terminal 38 and resistor 43 to input 9 of the varactor to bring the oscillator frequency back to the same frequency of oscillation previously existing at room temperature. It is noted that inasmuch as the thermistor resistance is at a maximum, the voltage drop across the thermistor resistance is large and hence the voltage which appears at tap 32 is essentially fed "straight through" to the output 38. Since the bias voltage at terminal 13 is of a negative polarity relative to the common electrical ground, the voltage at tap 32 is of negative polarity and this polarity is opposite to the polarity of the modulating voltage source. The algebraic "sum" of these voltages as hereinafter explained is thus a subtraction. Hence the "larger" the negative voltage at tap 38 the "smaller" is the net voltage at 9. Thereafter the oscillator unit, including the thermistor, is placed in a high temperature environment, suitably at 73° C., other factors remaining constant, and the oscillator frequency accordingly again drifts. At this temperature the resistance of thermistor 41 is at a relative minimum. Adjustable resistor 37 is adjusted until the amount of voltage applied from the temperature-dependent circuit to input 9 is sufficient in level (typically increased) such that the frequency of oscillation of the oscillator is brought back to the same frequency which it had at room temperature. Note that only a portion of the negative voltage at tap 32 appears at tap 38 since the drop across the thermistor is minimal. And the less negative voltage, the greater the net voltage at 9. With these two settings, the maximum negative voltage to be "added" to the voltage sum applied to varactor 3 by adjustment of tap 32 and the minimum negative voltage to be so "added" by adjustment of resistor 37, for the extreme of temperature, the amount of voltage compensation between these two temperature extremes is proportional to the linearity of thermistor 41. It is found that the frequency drift characteristics of the oscillator and the characteristics of the temperature-dependent voltage source as adjusted, match substantially so as to provide a temperature characteristic for the oscillator that is within the tolerable limits of 0.02 percent over the frequency range of interest. Furthermore the simple compensating circuit does not appear to interfere with the operation of the oscillator when the modulating voltage is swept over the entire frequency range at a very rapid rate.

Figure 2:
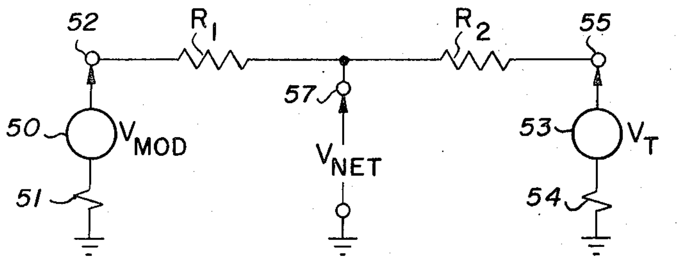
FIG. 2 illustrates the manner of combining compensating and modulating voltages employed in the embodiment of the invention of FIG. 1.

The manner in which the voltage of source 17 and the voltage of temperature-compensating source are combined to provide a net voltage at input 9 of varactor 3 in the embodiment of FIG. 1 is best explained in connection with the illustration of FIG. 2. In FIG. 2 a first voltage source 50 represents the modulating voltage source, connected between ground and terminal 52, having an effective series resistance 51. A second voltage source 53 represents the temperature-compensating voltage source, which has its output at 38 in the embodiment of FIG. 1, connected between ground and terminal 55, having an effective series resistance 54. Resistors $R_1$ and $R_2$ are in series between terminals 52 and 55 and correspond to the high value resistances 25 and 43 of FIG. 1. Terminal 57 between $R_1$ and $R_2$ represents the input terminal to varactor 3 at terminal 9 in FIG. 1 and the voltage $V_{NET}$ between ground and input terminal 57 corresponds to that net voltage applied across the varactor. Inasmuch as a varactor is a capacitance it has a very high resistance, typically on the order of a megohm or greater, the varactor can be considered an open circuit in which current does not flow. Resistors $R_1$ and $R_2$ are very large compared to the internal resistances 51 and 54 of the respective voltage sources, perhaps on the order, minimally, of ten times as large. The net voltage, $V_{NET}$, which appears at terminal 57 may be determined by the super position principle applicable in any linear network. By means of this theorem the voltage contributed by the first voltage source is first determined by replacing the second voltage source with an electrical short circuit, then calculating the voltage. The individual voltages thus calculated are then added to obtain the net voltage.

Thus with a short circuit across generator 53 the voltage contributed by source 50 is determined as follows:

$$V_1(57) = V_{MOD}(R_2/[R_1+R_2])$$

With a short circuit across source 50 the voltage contributed by source 53 is:

$$V_2(57) = V_T(R_1/[R_1+R_2])$$

Adding the two aforementioned voltages, the sum $V_{NET}$ is obtained:

$$V_{NET}= V_{MOD}(R_2/[R_1+R_2\ ) + V_T(R_1/[R_1+R_2\ )$$

In the instance where $R_1$ equals $R_2$, as I have selected in the preferred embodiment, the above sum reduces to the sum of the voltages $V_{MOD} + V_T$ multiplied by the fraction, ½.

As is clearly apparent, the voltage applied to the varactor is thus proportional to the algebraic "sum" of the voltages of the modulating voltage source and the temperature-dependent voltage source. In the preferred embodiment of FIG. 1, the temperature-dependent voltage source is poled negatively relative to the modulating voltage source. Hence $V_T$ in the foregoing calculation is actually $(-V_T)$ so that the net voltage $V_{NET} = ½\,(V_{MOD}+(-V_T))$, is actually proportional to the difference in voltage even though referred to as an algebraic "sum."

In one specific example, the voltage-tunable Gunn diode oscillator was a Model LS-1510, manufactured by Litton Industries, Electron Tube Division, San Carlos, Cal. Resistor 29 was 200 ohms, resistors 31 and 33 were each 100 ohms, resistor 35 was 1,000 ohms, resistor 37 was adjusted between 0 and 5,000 ohms, resistor 39 was 100,000 ohms and resistors 43 and 25 were each 240,000 ohms. All resistors were plus or minus 10 percent tolerances. Capacitor 27 had a value of 40 microfarads to match the stray capacity of varactor 3. The bias source 17 supplied −11.00 volts DC and the modulating voltage source 21 comprised an adjustable source of between 0 to +65 volts DC. Thermistor 41 was a Model No. GB35J1 supplied by the Fenwal Electronics Company. The termistor had a resistance of 400 ohms at −1° C, 5,000 ohms at −23° C., and 16,600 ohms at 73° C. and had a slightly logarithmic temperature resistance characteristic. While a linear characteristic is preferred, the particular thermistor, perhaps 5 percent off-linear within that range of temperature, as becomes apparent, did not adversely affect the results obtained.

Figure 3:
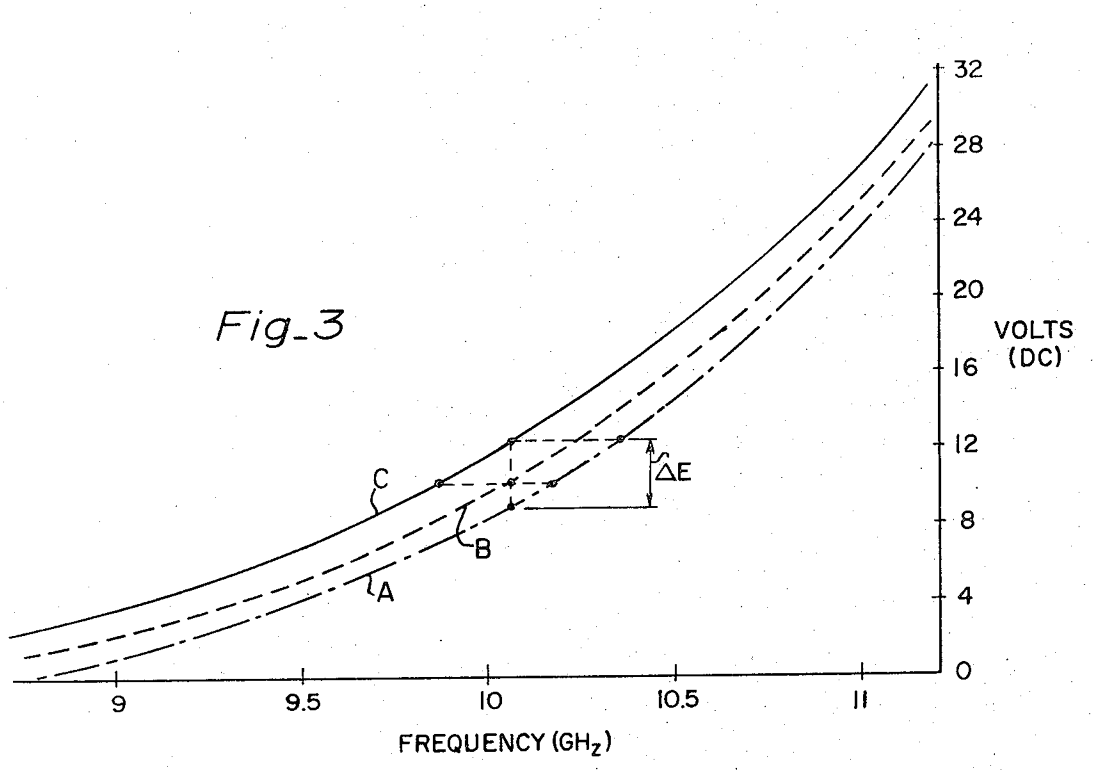
FIG. 3 illustrates the tuning charactristics of one specific uncompensated voltage-tunable Gunn diode oscillator.

Reference is made to FIG. 3. This figure shows the tuning curves of the uncompensated Gunn diode oscillator Litton Model LS-1510. Curve A shows the tuning over the band of frequencies from 9 to 11 GHz as a function of the voltage applied to the tuning varactor at an ambient temperature of −1° C. Curve B shows this same characteristic of the oscillator at a temperature of 23° C., room temperature, and Curve C shows the same characteristic at the temperature of 72°. As is apparent, the characteristic of the oscillator changes from room temperature (23° C.) and the other extremes of temperature. Thus for example, given a varactor voltage of 10 volts at the lowest temperature the oscillator frequency is approximately 10.15 GHz, at room temperature the output frequency is approximately 10.05 GHz, and at the highest temperature the output frequency is 9.85 GHz. The drift of the oscillator frequency between room temperature and the highest temperature, a difference of 50° C., is approximately 0.20 GHz. Considered as drift this represents a shift of frequency of 0.0004 GHz per degrees centigrade or 0.04 percent 1° C.

As is apparent, to effect a change in the oscillator frequency at the higher temperature so as to be at the same frequency at room temperature requires the varactor voltage to be increased by approximately 2 volts to 12 volts. On the other hand, going from room temperature to the lowest temperature and maintaining the frequency constant requires a change in the varactor voltage of 1 volt less down to 9 volts. For perfect temperature compensation therefore at this frequency the temperature-dependent voltage source must reduce the net voltage by 1 volt at −1° C. and should increase the net voltage to the varactor by 2 volts at 73° C. This is a range of approximately 3 volts. If the compensating network linearly changes between these two ranges it provides adequate amounts of compensating voltages at temperatures between these two extremes of range.

In the specific embodiment the modulating voltage was adjusted to a level of 10 volts so as to bring the oscillator to a frequency of 10.05 GHz at room temperature (23° C.), as is indicated on Curve B in FIG. 3. The oscillator unit is then placed in an ambient temperature of −1° C. which with 10 volts on the varactor would raise the frequency to approximately 10.15 GHz as is seen in Curve A of FIG. 3. Potentiometer tap 32 is then adjusted so as to provide the maximum negative voltage at terminal 38 sufficient to bring the oscillator frequency back to 10.05 GHz. As appears in Curve A of FIG. 3 this requires that the net voltage at terminal 9 of the varactor be reduced from 10 volts by approximately 1.2 volts to 8.8 volts. Inasmuch as the output at 9 is one-half of the voltage at the output 38 of the temperature-compensating voltage source, as previously described, the voltage at output 38 is approximately −2.4 volts. After that adjustment the oscillator unit is brought to an ambient temperature of 73° C. This normally results in the oscillator freqeuncy drifting down to 9.85 GHz with 10 volts on the varactor as seen in Curve C of FIG. 3. Resistor 37 is adjusted to reduce the negative output voltage at output terminal 38 so as to result in an increase of voltage applied to the varactor sufficient to cause the oscillator unit to oscillate at the original frequency of 10.05 GHz. Note that $\Delta E$ is the total offset voltage or range of voltage to be provided to the varactor input by the temperature-dependent source, and, hence the latter must provide a range of $2\Delta E$ at its output terminal 38.

Figure 4:
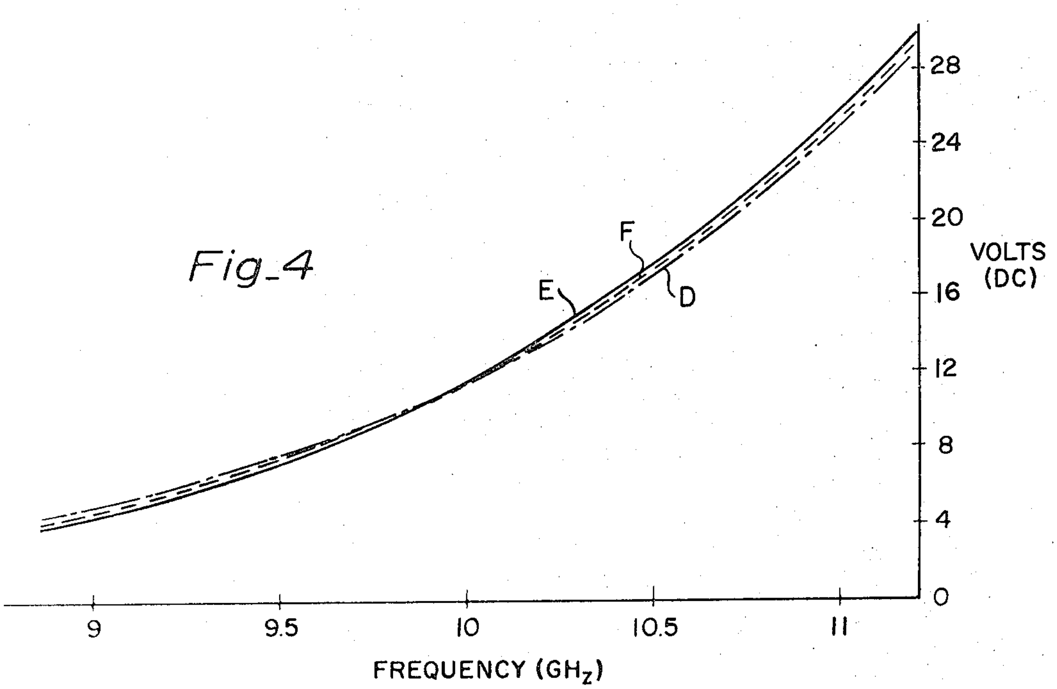
FIG. 4 illustrates the improved tuning characteristics of the specific Gunn diode oscillator used in connection with FIG. 3 modified according to the teachings of my invention.

With these adjustments accomplished, the unit possessed the tuning characteristics illustrated in FIG. 4. Reference to Curves D, E, and F shows that the oscillator tuning characteristic is substantially independent of temperature within 0.02 percent per degree centigrade.

As is apparent, the tuning curves are relatively close together and illustrate a minimal change of oscillator frequency or drift with temperature. Reference is again made to FIG. 1. Resistors $R_6$ and $R_5$ adjust the ratio of $\Delta E$ supplied to the varactor. As was previously described, a range of 3 volts is necessary for this particular oscillator. Since only one-half of the voltage from the source at tap 38 is applied to the varactor, the voltage divider network must vary over a range of 6 volts. Obviously this range can be increased or decreased to suit the necessities of any particular oscillator by adjustment of the resistors and the relative proportion of resistances in the respective bridges.

The invention thus provides a relatively simple temperature-compensation arrangement combined with a conventional Gunn diode oscillator. Moreover inasmuch as the compensating network derives its voltage from the same bias source as supplies bias voltage to the Gunn diode oscillator, there is no need for additional bias supplies. Moreover the electrical elements do not involve any mechanical parts movement in order to effect the compensation. Hence the oscillator is relatively immume from changes in frequency as a result of mechanical vibration or shock.

It is believed that the foregoing detailed description of a preferred embodiment of my invention adequately presents one skilled in the art with the information necessary to enable such person to make and use my invention. However I wish it to be expressly understood that my invention is not to be limited to those disclosed details, inasmuch as numerous changes, modifications and addition, even improvements, become apparent to those skilled in the art upon reading this specification. For example, although I have shown adjustable potentiometers and resistors, these may be replaced by resistors of fixed values. Likewise, although I employ a thermistor having a negative temperature coefficient of resistance in one arm of the resistor network, one might replace that with a thermistor having a positive temperature coefficient of resistance and locate same in the other arm of the network or to use combinations of thermistors. And although the oscillator is illustrated as containing a single varactor and Gunn diode, the invention equally applies to oscillators in which two or more varactors are incorporated or one or more Gunn diodes are employed as the high frequency source.

Accordingly it is respectfully requested that my invention be broadly construed within the full spirit and scope of the appended claims.

What I claim is:

1. In a voltage tunable oscillator of the type which includes:

a Gunn diode as an active element, said diode having an input for receiving a bias voltage;

a frequency-determining network coupled to said Gunn diode for establishing the oscillator output frequency;

a varactor having an input for receiving a modulating voltage and coupled in said frequency-determining network for changing the characteristic of said frequency-determining network as a function of the voltage applied to said input to thereby change said oscillator output frequency;

a source of bias voltage for energizing said Gunn diode, said source being connected with its negative polarity terminal in circuit with said Gunn diode input and its positive polarity terminal connected to ground potential; and a source of modulating voltage, said source of modulating voltage having its negative polarity terminal connected to ground potential and having its positive polarity terminal connected in circuit with said varactor input;

said oscillator being of the type which has a tuning characteristic which changes as a function of ambient temperature;

the improvement comprising in combination therewith;

compensating voltage source means for providing an output voltage, which output voltage is a predetermined function of ambient temperature, a predetermined fraction of which voltage when applied to said varactor input automatically adjusts said varactor to render the oscillator tuning characteristic substantially independent of ambient temperature within 0.02 percent per degrees centigrade over a predetermined frequency range;

said compensating source comprising:

a first resistor voltage divider network comprising series connected resistors, said first resistor voltage divider network being connected in circuit between said negative polarity terminal of said bias source and electrical ground potential, and said first resistor voltage divider network including a potentiometer having a selectively positionable tap for permitting selective adjustment of the voltage appearing at said tap;

a second resistor voltage divider network, said second resistor voltage divider network being connected in circuit between said positionable tap of said potentiometer and electrical ground potential, and said second resistor voltage divider network including:

an adjustable resistor, an output tap, said adjustable resistor being included in series circuit between said positionable tap and said output tap, thermistor means having a negative temperature coefficient of resistance, said thermistor means being connected in circuit between said output tap and electrical ground potential, and a resistor connected across said thermistor;

summing circuit means for algebraically summing a fraction of said modulating voltage and a predetermined fraction of said output voltage of said compensating voltage source means and applying such sum to said varactor input;

said summing means comprising further:

first high resistance means connected in series circuit between said varactor input and said modulating voltage source; and second high resistance means connected in series circuit between said output tap of said second resistor voltage divider network and said varactor input;

whereby the tuning characteristic of said improved oscillator is substantially independent of ambient temperature over a wide range of ambient temperatures.

* * * * *